United States Patent [19]
Yoshino et al.

[11] Patent Number: 5,912,186
[45] Date of Patent: Jun. 15, 1999

[54] METHOD FOR PROCESSING SEMICONDUCTOR MATERIAL

[75] Inventors: Akira Yoshino; Takashi Yokoyama; Yoshinori Ohmori; Kazuma Yamamoto, all of Osaka, Japan

[73] Assignee: Daido Hoxan, Inc., Hokkaido, Japan

[21] Appl. No.: 08/755,762

[22] Filed: Nov. 21, 1996

[30] Foreign Application Priority Data

Nov. 21, 1995 [JP] Japan ................................ 7-302749
Nov. 21, 1995 [JP] Japan ................................ 7-302750

[51] Int. Cl.⁶ .................................................. H01L 21/302
[52] U.S. Cl. ........................... 438/708; 438/714; 438/719; 216/65
[58] Field of Search ................................... 438/463, 708, 438/714, 719; 216/65

[56] References Cited

U.S. PATENT DOCUMENTS

| | | | |
|---|---|---|---|
| 2,841,477 | 7/1958 | Hall | 41/42 |
| 5,151,389 | 9/1992 | Zappella | 437/226 |
| 5,352,327 | 10/1994 | Witowski | 156/646 |
| 5,534,107 | 7/1996 | Gray et al. | 156/643.1 |

FOREIGN PATENT DOCUMENTS 58-196022  11/1993  Japan.

*Primary Examiner*—Bruce Breneman
*Assistant Examiner*—Anita Alanko
*Attorney, Agent, or Firm*—Armstrong, Westerman, Hattori, McLeland & Naughton

[57] ABSTRACT

A method for processing semiconductor materials such as a crystalline ingot or a wafer and an apparatus employed therein. An etching gas is supplied on the surface of a semiconductor material, while laser irradiation or light quantum irradiation is applied on a predetermined part of the semiconductor material surface, whereby a component of the etching gas is excited, reacted with a component of the semiconductor material and evaporated for elimination. Thereby, semiconductor materials can be processed hygienically, easily and with high precision.

4 Claims, 6 Drawing Sheets

METHOD FOR PROCESSING SEMICONDUCTOR MATERIAL

FIELD OF THE INVENTION

The present invention relates to a method for processing a semiconductor material such as a crystalline ingot or a wafer and apparatus employed therein.

BACKGROUND OF THE INVENTION

A wafer employed for various kinds of semiconductor devices can generally be obtained by cutting out a crystalline ingot such as Si or GaAs at specific intervals so as to be formed into a plate and mirror polishing its surface wherein a diamond blade saw or a wire saw for metal cutting is employed heretofore. Namely, an ingot is cut out with impact caused by pressing a diamond blade rotating at a high speed or a wire saw vibrating at a high speed thereon.

Besides, thus obtained wafer surface is processed in minute detail, for example, by a recessing process so that semiconductor devices such as a large scale integrated circuit (LSI) can be formed. As such a minute process, there are a method wherein a wafer surface is melted with a carbon dioxide gas laser, a YAG laser or the like and evaporated so as to be recessed, a method wherein resist is applied on a wafer surface and etching is conducted by a specific method after exposure so that a recess can be formed.

However, there is a problem in cost effectiveness in the method of cutting out a crystalline ingot because it is impossible to cut out only the part cut into by a diamond blade or a wire and also the neighborhood is deformed or destroyed so that an extra space in a sizeable thickness is wasted. More specifically, about 500 μm thickness is wasted to cut out a piece of wafer, which means about 50% of an ingot may be wasted when cutting out a wafer of 500 μm thickness. In addition, as such tools are repeatedly used for cutting out, the edge may be nicked and the sharpness may deteriorate, so that a diamond blade, a wire or the like requires time-consuming work of periodical replacement. Further, there is another problem that smear of cutting fluid charged into portions to be cut as purposes for cooling and lubrication, and debris caused in a cutting process may scatter and deteriorate the work environment. Still further, the cutting fluid including the debris is difficult to be recycled or disposed because a troublesome process, i.e., separation of the debris and the cutting fluid is indispensable.

Figure 9:
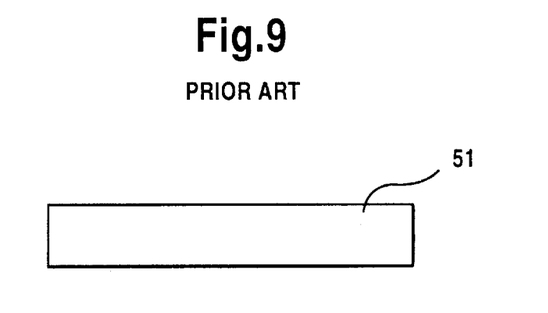
FIG. 9 is an explanatory view of a general method for recessing a wafer surface.
Figure 10:
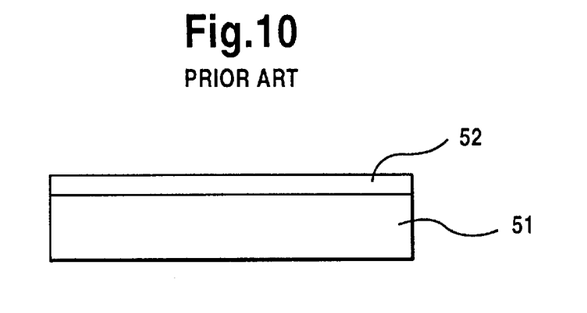
FIG. 10 is an explanatory view of a general method for recessing a wafer surface.
Figure 11:
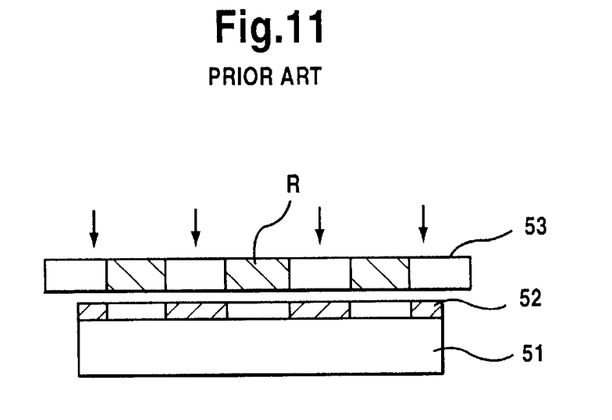
FIG. 11 is an explanatory view of a general method for recessing a wafer surface.
Figure 12:
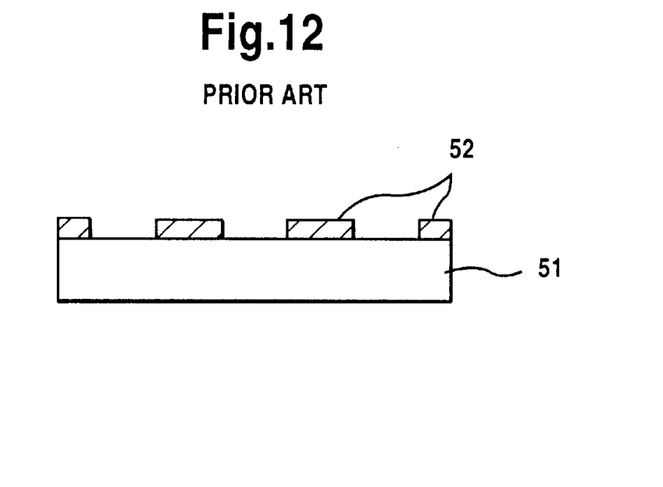
FIG. 12 is an explanatory view of a general method for recessing a wafer surface.
Figure 13:
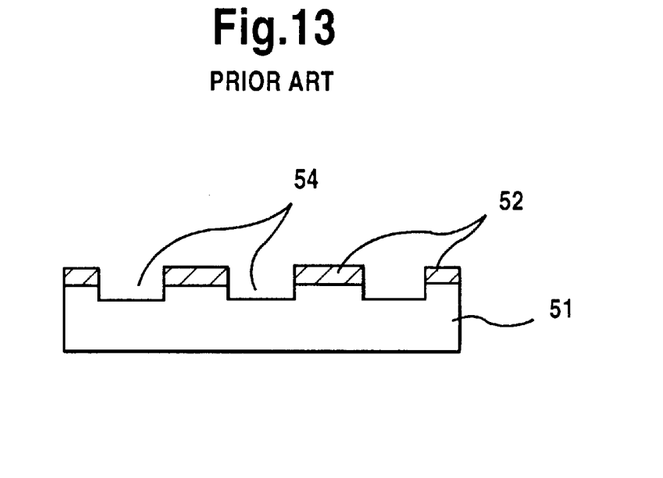
FIG. 13 is an explanatory view of a general method for recessing a wafer surface.
Figure 14:
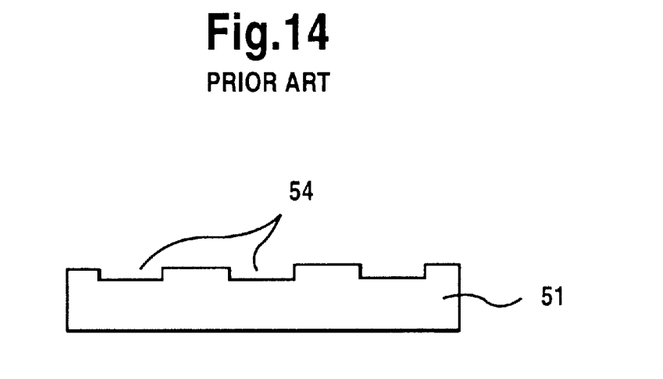
FIG. 14 is an explanatory view of a general method for recessing a wafer surface.

In the meantime, in a method wherein a laser or the like is employed for minutely processing a wafer, there are problems that processing accuracy is not good because a wafer surface is melted so that melted liquid may swell or flow, and that a wafer component which is melted and evaporated may adhere to the other part of the wafer surface, be cooled and hardened, resulting in deterioration in surface smoothness. Meanwhile, in a method wherein etching is conducted after application of resist, for example, photoresist (photosensitive organic high polymer) 52 is applied on a surface of a wafer 51 of FIG. 9, as shown in FIG. 10, and a photo mask 53 wherein a predetermined circuit pattern (net portions Rs) is printed is attached thereon and exposed to light (FIG. 11). After being developed, unexposed parts (solved into developing solution) of the resist 52 are flowed away as shown in FIG. 12 so that a pattern forms on the surface of the wafer 51. Subsequently, a recess 54 can be formed (shown in FIG. 13) by plasma dry etching or the like using the resist 52 as a mask and the resist 52 is peeled off and cleaned, resulting in a wafer 51 (shown in FIG. 14) wherein a recess 54 as a circuit pattern is formed. This is a complicated process and means bad productivity. Furthermore, all the resist 52 applied on the whole surface of the wafer 51 is removed finally, which brings about high cost in materials and disposal or recycle of the liquid.

Accordingly, it is an object of the present invention to provide a superior method for processing a semiconductor material, for example, cutting of a crystalline ingot, minute processing on a wafer surface and the like, hygienically, easily and precisely, and an apparatus employed therein.

To accomplish the above object, the first gist of the present invention is a method for processing a semiconductor material comprising steps of supplying etching gas to a surface of the semiconductor material, while applying laser radiation or light quantum irradiation on a predetermined part thereof to be processed so as to be removed, exciting a gas component of the etching gas on the predetermined part, and chemically reacting a constituent of the semiconductor material and the excited gas component so as to be volatilized and removed.

Meanwhile, the second gist of the present invention is an apparatus employed for processing a semiconductor material comprising a closed chamber provided with a mounting part for mounting the semiconductor material and transporting means for moving the semiconductor material mounted on the mounting part, means for supplying etching gas into the chamber, means for withdrawing exhaust gas from the chamber, and means for exciting the etching gas by applying laser radiation or light quantum irradiation from the outside of the chamber on the mounted semicondutor material.

SUMMARY OF THE INVENTION

Now, the present invention will be described in detail.

First, as semiconductor materials, there are various kinds of crystalline ingot heretofore employed as a wafer material, a wafer obtained therefrom, or the like. As these materials, there are, for example, a monocrystal or a polycrystal of Si, GaAs, $SiO_2$, $Si_3N_4$, $Al_2O_3$, or the like. The shapes of the crystalline ingot and the wafer are not limited specifically.

As an etching gas for processing the semiconductor material, those which have physical property of reacting with a component of the semiconductor material so as to produce volatile matter are optimum, for example, $NF_3$, $CCl_2F_2$, $CF_4$, $C_2F_6$, $C_3F_8$, $CHF_3$, $CCl_4$, $SF_6$, $CCl_3F$, $ClF_3$, HCl and the like. These gases are employed solely or in combination of two or more.

In the meantime, to excite the gas component of the etching gas, laser radiation or light quantum irradiation is conducted. In the laser radiation, a laser beam with wave length within a range of 0.1 to 10 μm is preferable, for example, YAG, Ar and the like The output thereof is usually set up within a range of 1 to 100 w. Meanwhile, in the light quantum irradiation, it is preferable to employ Hg, Xe or the like usually within a range of 0.1 to 10 kw as a light source. It is preferable to arrange in such a manner that the semiconductor material surface is heated up from 300 to 600° C. with such irradiation. Namely, the heating less than 300° C. does not impart sufficient exciting effect toward the etching gas, resulting in a dull reaction. On the other hand, the heating over 600° C. may cause thermal quality change of the processed semiconductor materials.

Further, it is preferable for such irradiation to be passed through light gathering means such as a convex lens so that the laser irradiation or light quantum irradiation may not diffuse on the semiconductor material surface but irradiate the predetermined limited narrow part with concentration. It is preferable to set up a spot diameter of the semiconductor material to be heated up to not less than 300° C. with the laser irradiation or light quantum irradiation within a range of about 1 to 100 μm.

BRIEF DESCRIPTION OF THE DRAWINGS

The invention will be more fully described and will be better understood from the following description, taken with the appended drawings, in which.

DESCRIPTION OF THE PREFERRED EMBODIMENTS

The following are the detailed description of the various embodiments.

EXAMPLE 1

Figure 1:
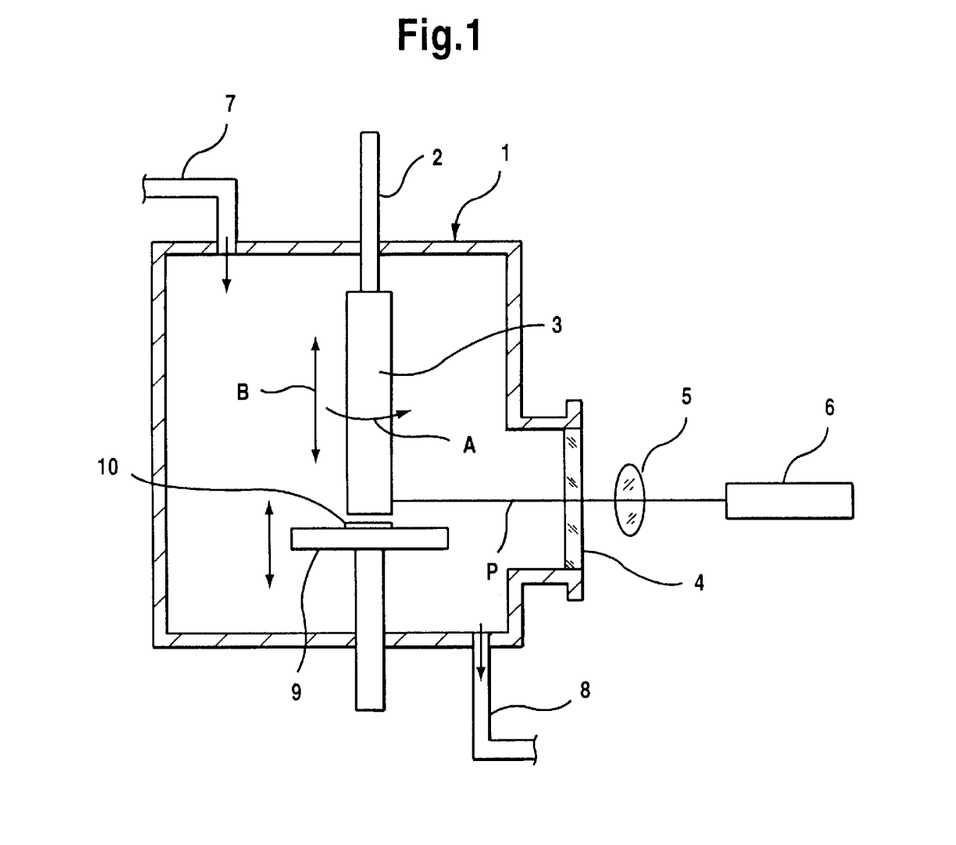
FIG. 1 is a schematic view of an apparatus of one embodiment according to the present invention.

FIG. 1 illustrates one embodiment of an apparatus used in a method for obtaining a wafer by applying laser irradiation on a cylindrical crystalline ingot according to the present invention. In this apparatus, a shaft 2 suspended from above is installed in the center of a closed chamber 1. A cylindrical crystalline ingot (just referred to as an ingot hereinafter) 3 is to be attached to the lower end of the shaft 2 coaxially. Besides, rotation or up-down movement can be imparted to the shaft 2 from the outside of the chamber 1, whereby the ingot 3 may be driven circumferentially as shown in an arrow A or perpendicularly as shown in an arrow B.

Further, a transparent window 4 made of quartz glass is established on the side wall of the chamber 1. A laser transmitter 6 is aligned via a convex lens 5 for gathering light in face of the transparent window 4 so that laser irradiation may be conducted on the surface of the ingot 3.

Furthermore, a supply tube 7 through which an etching gas is introduced for cutting the ingot 3 into the chamber 1 is connected to the ceiling of the chamber 1 while a withdrawal tube 8 for withdrawing an exhaust gas is connected to the bottom of the chamber 1.

Still further, 9 is a wafer holding stage which holds the wafers 10 cut out from the ingot 3 and descends by each thickness thereof. When a specific amount of wafers 10 has accumulated, wafer withdrawal means (not shown) connected with a lower side of the chamber 1 operates so that the wafers 10 on the stage 9 are taken to the outside. When wafers 10 are taken away and the stage 9 becomes vacant, the stage 9 ascends up to an initial height so as to accumulate other wafers 10 to be cut out.

By employing the above apparatus, wafers 10 can be cut out, for example, as follows. Namely, first a cylindrical ingot 3 made of Si monocrystal is attached to the shaft 2 and mounted on the chamber 1. Consecutively, a vacuum is drawn from the exhaust gas withdrawal tube 8 so that the chamber 1 is evacuated at an order of $10^{-3}$ torr. Then, $NF_3$ gas is introduced therein through the etching gas supply tube 7.

Figure 2A:
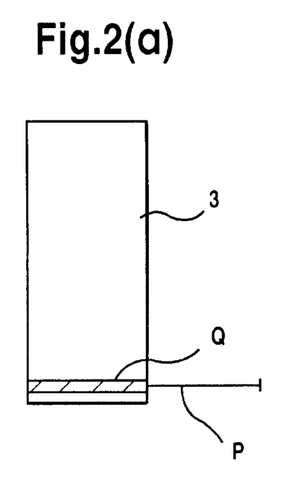
FIG. 2(a) is an explanatory view for the first step of cutting out a wafer according to the above apparatus.

Successively, the laser transmitter 6 is actuated so that a laser beam P is focused on one predetermined spot (a shadowed portion Q) of the surface of the ingot 3 as shown in FIG. 2(a) At that time, light gathering condition is arranged in such a manner that the spot diameter of a photo recipient of the surface of the ingot 3 is within 100 μm and the temperature on the spot of the ingot 3 is within a range of 300 to 600° C. In this state, $NF_3$ is excited on the surface neighborhood of the ingot 3 and Si of a component of the ingot 3 and $NF_3$ gas are reacted as follows so that the ingot 3 can be etched.

$4NF_3+3Si \rightarrow 3SiF_4(\text{volatile matter})+2N_2(\text{gas})$

Figure 2B:
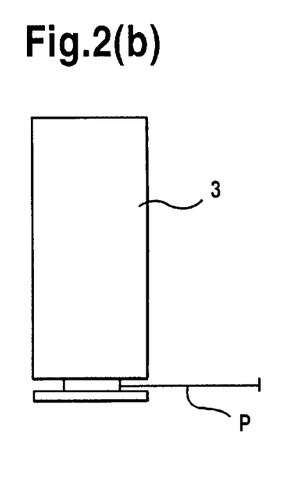
FIG. 2(b) is for the second step thereof and FIG. 2(c) is for the third step thereof.
Figure 2C:
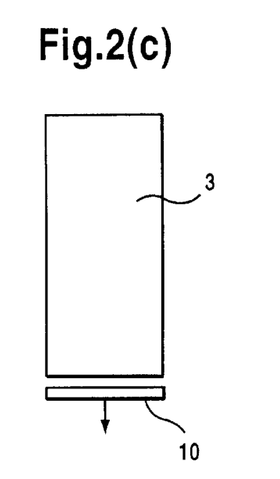

Therefore, the ingot 3 is rotated via the shaft 2 slowly, the part where the laser beam P is applied moves circumferentially step by step, as shown in FIG. 2(b), so as to be recessed. Finally, as shown in FIG. 2(c), the wafer 10 can be cut out by etching the predetermined portion wholly. The cutout wafer 10 drops on the stage 9 (as shown in FIG. 1).

Next, laser irradiation is interrupted and the shaft 2 is descended by the thickness of the wafer 10 (for example, 500 μm)+an extra space (for example, 100 μm) so that the ingot 3 is positioned in such a manner that a next predetermined part receives a laser beam. Then, laser irradiation is resumed so that a next wafer 10 is cut out in the same way as the above. By repeating this process, wafers 10 can be obtained at specific intervals consecutively. Besides, the wafers 10 piled on the stage 9 are taken away from the chamber 1 periodically by the wafer withdrawal means as mentioned above.

Since the laser beam superior in parallelism can be gathered and the spot diameter can be focused (for example, not more than 100 μm) according to the above apparatus, an etching gas ($NF_3$) can be excited within the range so as to evaporate and remove the surface of the ingot 3 whereby an extra space can be greatly decreased compared with the prior methods, resulting in minimizing waste in cutting Further, the work environment is clean and hygienic because cutting fluid or debris is not scattered, which is different from the prior methods. Furthermore, the present invention realizes good workability without tool replacement.

EXAMPLE 2

Figure 3:
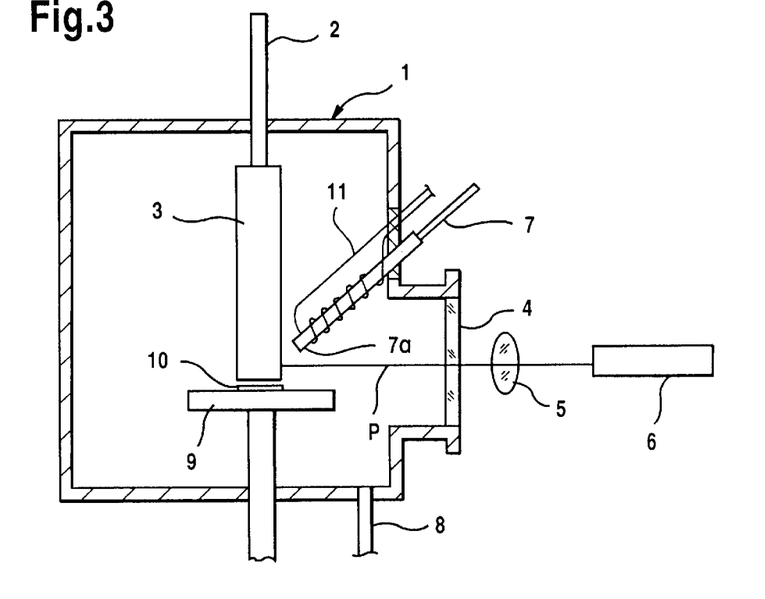
FIG. 3 is a schematic view of an apparatus of another embodiment according to the present invention.

FIG. 3 illustrates another embodiment. In Example 1, excitement of the etching gas is conducted with laser irradiation only, while in Example 2, the etching gas itself introduced into the chamber 1 is heated so that excitement can be conducted within a shorter time. Namely, in this apparatus, a lower-flow end 7a of an etching gas supply tube 7 extends near to a recipient part of a laser beam, and a heater coil 11 is wound up on the peripheral of the lower-flow end 7a. The etching gas passing therethrough is heated by the heater coil 11 up to a high temperature, and to be sprayed on a surface of the ingot 3 in such a state. The same effects can be realized in this method as in Example 1. Further, excitement of the etching gas can be conducted in a shorter time, resulting in a shorter processing time compared with Example 1. In addition, it is preferable to set up a heating temperature of the etching gas at about 300 to 600° C. as the same as in heating with a laser beam. However, the method for heating the etching gas is not limited to the method shown in FIG. 3.

EXAMPLE 3

Figure 4:
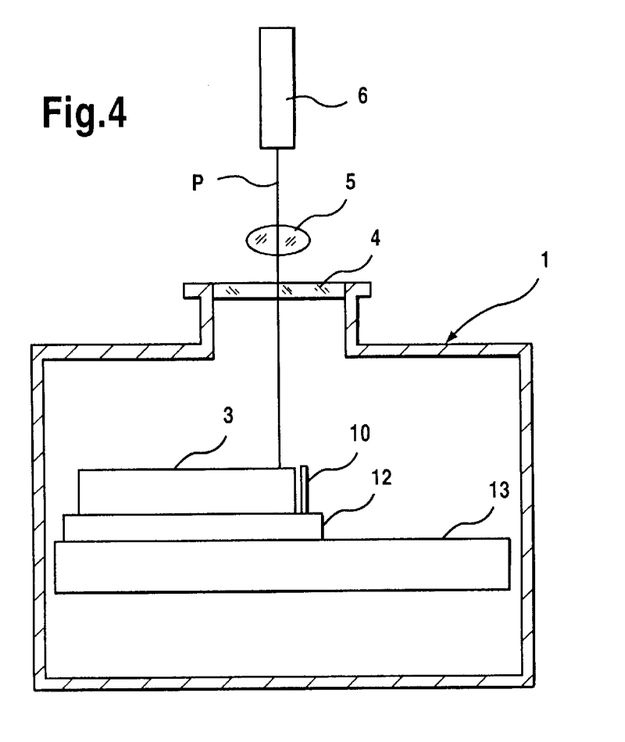
FIG. 4 is a schematic view of an apparatus of still another embodiment according to the present invention.

FIG. 4 shows further another embodiment. In Examples 1 and 2, the ingot 3 is in a cylindrical shape, installed on the shaft 2 and is rotated, or descended or ascended so that every small area of the predetermined part to be cut is moved gradually. On the other hand, this apparatus is suitable for processing a prismatic ingot 3. Namely, the ingot 3 is put on an X-Y stage 127 given irradiation of a laser beam P, as shown in the figure, and moved through the X-Y stage 12 horizontally or perpendicularly. In addition, in the figure, 13 is a base supporting the X-Y stage 12. The same effects can be realized in using this apparatus as in Example 1.

EXAMPLE 4

Figure 5:
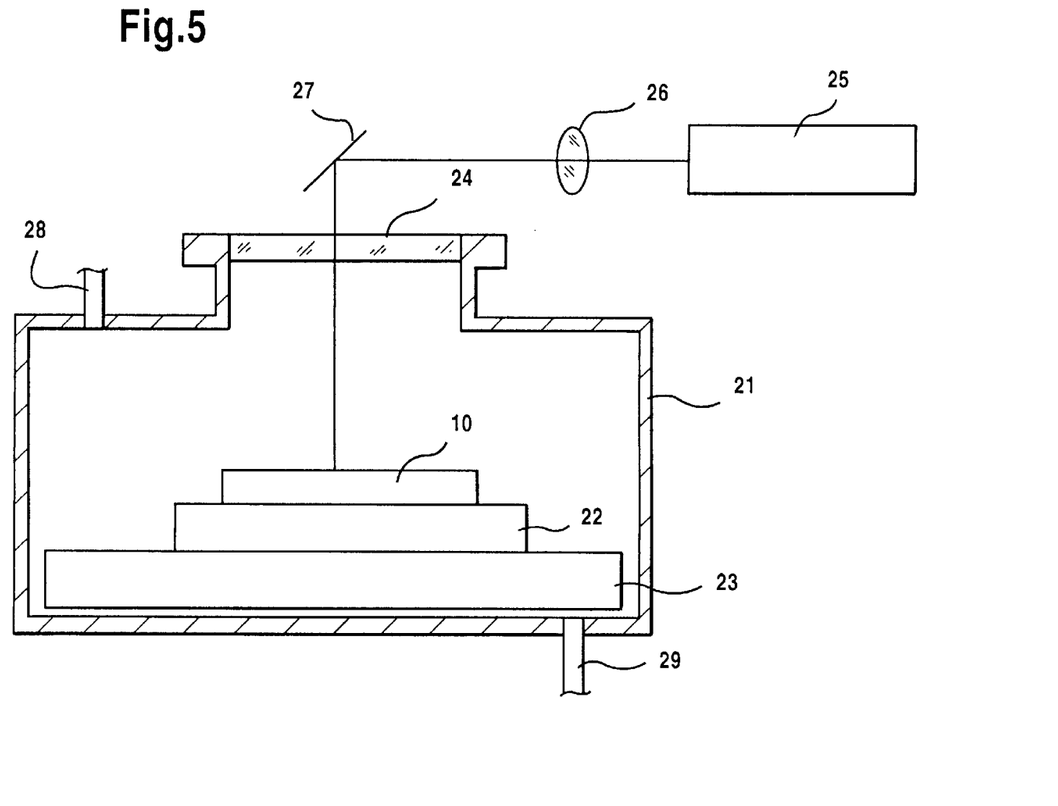
FIG. 5 is a schematic view of an apparatus of even another embodiment according to the present invention.

FIG. 5 illustrates one embodiment of an apparatus for conducting a minute processing on a monocrystal silicon wafer surface with laser irradiation according to the present invention. This apparatus contains an X-Y stage 22 movable arbitrarily in a direction X-Y with wafers 10 thereon in a chamber 21 and a base 23 supporting the stage.

Further, a transparent window 24 made of quartz glass is established on the ceiling of the chamber 21. Laser irradiation from a laser transmitter 25 aligned outside of the chamber 21 passes through the window 24 via a convex lens 26 for gathering light and a reflecting mirror 27 for refracting the passage of a laser beam at a right angle, and finally reaches a surface of a wafer 10. In the figure, 28 is an etching gas supply tube and 29 is an exhaust gas withdrawal tube 29.

Furthermore, the wafer 10 is mounted on the X-Y stage 22 and withdrawn automatically after being processed minutely by means for loading and withdrawing wafers (not shown) connected to a side wall of the chamber 21.

By employing the apparatus, minute processing of recessing can be conducted on the surface of the wafer 10, for example, as follows. First, a wafer made of Si monocrystal is put on the X-Y stage 22. Next, a vacuum is drawn from the exhaust gas withdrawal tube 29 so that the chamber 21 is evacuated at an order of $10^{-3}$ torr. Then, $NF_3$ gas is introduced therein through the etching gas supply tube 28.

Figure 6:
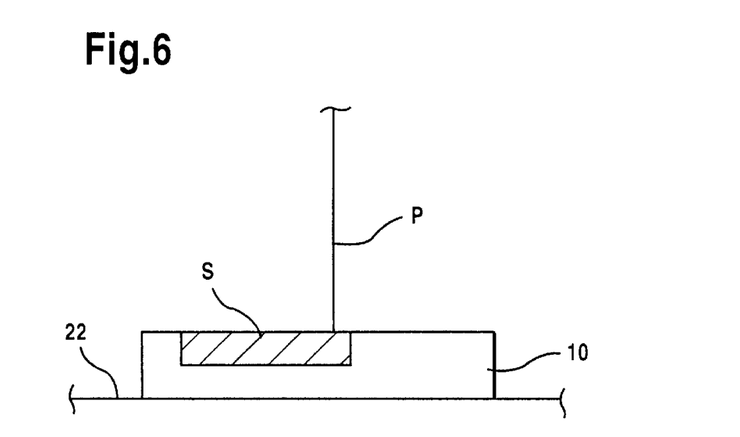
FIG. 6 is an operational view for recessing according to the above apparatus.
Figure 7:
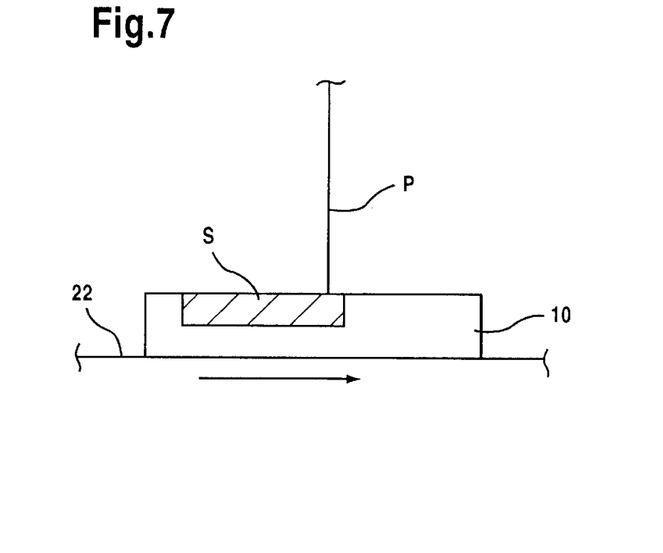
FIG. 7 is an operational view for recessing according to the above apparatus.

Successively, the laser transmitter 25 is actuated as shown in FIG. 6, the laser beam P is focused upon one predetermined spot to be recessed (a shadowed portion S) of the surface of a wafer 10. At that time, light gathering condition is arranged in such a manner that the spot diameter of a photo recipient is within 100 μm and the surface temperature on the spot of the wafer 10 is within a range of 300 to 600° C. In this state, $NF_3$ is excited on the surface neighborhood of the wafer 10, as shown in FIG. 7, so that the photo recipient of the surface of the wafer 10 can be etched in the same way as in Example 1.

Therefore, as the wafer 10 is moved slowly with the X-Y stage 22 in a direction of right to left as shown by an arrow, the part to be irradiated with the laser beam P moves gradually so as to be recessed. Finally, all the predetermined part S is etched, whereby an aiming minute processing can be conducted. The wafer 10 after being processed is withdrawn from the chamber 21.

Since the laser beam superior in parallelism can be gathered and the spot diameter can be focused on (for example, within a range of about 1 to 100 μm) according to the above method, an etching gas ($NF_3$) can be excited within the range so as to evaporate and remove the very spot on the surface of the wafer 10. This means that only if the suitable spot diameter is established in accordance with the recess width and the moving speed of the X-Y stage 22 is adjusted, the recessing in the aiming shape can be conducted precisely. Further, since the surface of the wafer 10 is not melted to be evaporated but a component of the wafer 10 is removed as volatile matter by chemical reaction in this method, there is no fear of re-adhesion, unlike the case that a wafer surface is melted and evaporated. Furthermore, since this method does not require multiple processes necessary for a method of dry etching with masking of resist, product efficiency is excellent and cost reduction can be achieved with no extra cost for materials and processing necessary for resist, photomask and the like. Still further, the surface of the wafer 10 is heated to 300 to 600° C. with the laser beam P, which will not cause any problem in device production or thermally damage the wafer 10.

Figure 8:
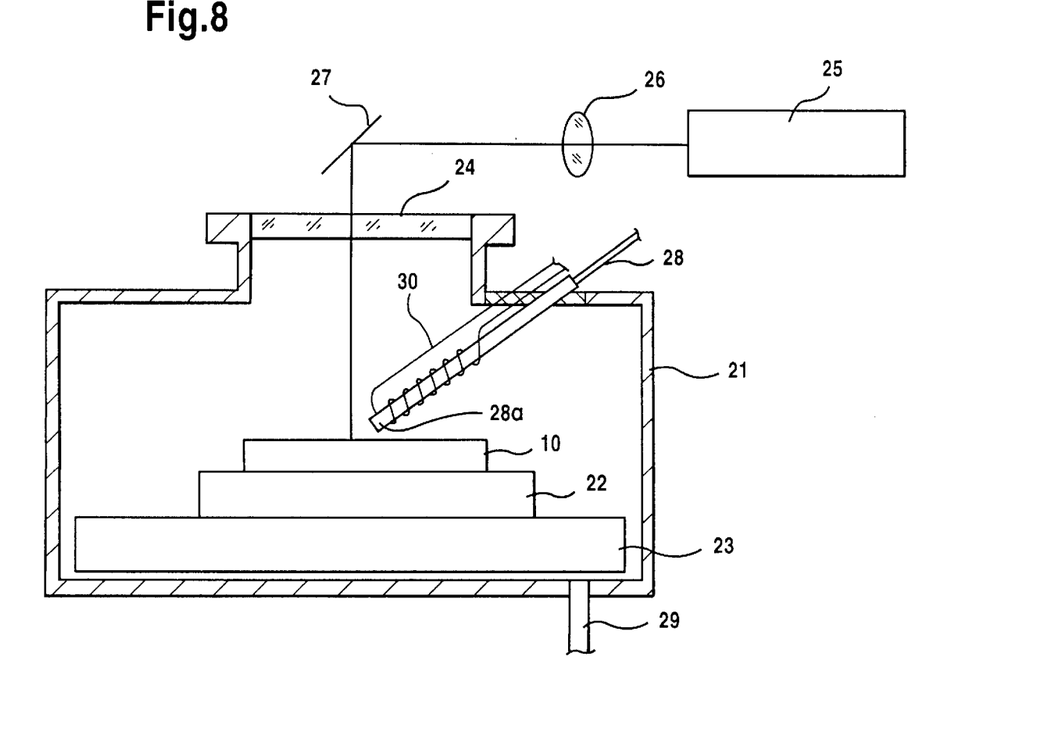
FIG. 8 is a schematic view of an apparatus of even still another embodiment of the present invention.

FIG. 8 illustrates another embodiment of the present invention. Namely, in this apparatus, a lower-flow end 28a of an etching gas supply tube 28 extends near to a recipient part of a laser beam, a heater coil 30 is wound up around the lower-flow end 28a. The etching gas passing therethrough is heated by the heater coil 30 up to a high temperature, and sprayed on a surface of the wafer 10 in such a state. The same effects can be realized in this method as in Example 4. Further, excitement of the etching gas can be conducted in a shorter time, resulting in a shorter processing time compared with Example 4. In addition, it is preferable to set up a heating temperature of the etching gas at about 300 to 600° C. as the same as in heating with the laser beam. However, the method for heating the etching gas is not limited to the method shown in FIG. 8.

Of course, in these Examples, the laser transmitters 6 and 25 may be replaced by a light emitting apparatus such as Hg lamp and excitement of the etching gas may be conducted by light quantum irradiation.

Besides, in case that the material is processed with a repetitive pattern, plural laser transmitters such as 6 or 25 may be installed in one chamber such as 1 or 21 at different positions so that plural laser beams can be applied on the ingot 3 or the wafer 10 for simultaneously conducting processing on the same patterns, resulting in improvement in workability.

EFFECTS OF THE INVENTION

As mentioned above, the present invention relates to a method wherein the etching gas is excited with laser irradiation or light quantum irradiation so that a gas component of the etching gas and a component of the semiconductor material are chemically reacted whereby the predetermined part on the surface of the semiconductor material is volatilized and removed. Therefore, according to a method of the present invention, laser irradiation or light quantum irradiation can be focused on a small area (a spot diameter: about 1 to 100 μm), within which the surface of the material can be volatilized and removed, whereby an aiming shape can be obtained with high precision. Especially, in case that a wafer is cut out from a crystalline ingot according to the above method, an extra space can be greatly decreased compared with the prior methods, resulting in minimizing waste in cutting. Further, the work environment is clean and hygienic because cutting fluid or debris is not scattered, which is different from the prior methods. Furthermore, the present invention realizes good workability without tool replacement. Still further, since a component of the wafer is removed as volatile matter by chemical reaction in this method of processing a minute recess on the wafer surface, different from the method wherein the wafer surface is melted and evaporated, there is no fear of re-adhesion unlike the former case. Furthermore, since the present invention does not require multiple processes necessary for a method of dry etching with masking of resist, product efficiency is excellent and cost reduction can be achieved with no extra cost for materials and processing necessary for resist, photomask and the like. Still furthermore, the above method can be performed effectively by using the apparatus of the present invention.

What is claimed is:

1. A method for processing a semiconductor material comprising steps of; supplying an etching gas heated between 300 and 600° C. to a part to be removed on a surface of the semiconductor material by spraying while applying laser radiation or light quantum irradiation on a part on which the etching gas is sprayed to be removed by processing, exciting a gas component of the etching gas on the irradiated part, and chemically reacting a constituent of the semiconductor material and the excited gas component so as to be volatilized and removed.

2. A method of processing a semiconductor material according to claim 1, wherein the etching gas comprises at least one component which is selected among the group consisting of $NF_3$, $CCl_2F_2$, $CF_4$, $C_2F_6$, $C_3F_8$, $CHF_3$, $CCl_4$, $SF_6$, $CCl_3F$, $ClF_3$ and $HCl$.

3. A method of processing a semiconductor material according to any of claims 1 or 2, wherein the semiconductor material is a crystalline ingot, comprising steps of supplying the etching gas to a part of the crystalline ingot to be cut while exciting a gas component of the etching gas by laser radiation or light quantum irradiation, chemically reacting a constituent of the crystalline ingot and the excited gas component so as to volatilize and remove every irradiated area of the crystalline ingot and repeating thereof successively with a position of the area moved, and finally removing all the irradiated parts by volatilization so as to cut out a wafer.

4. A method of processing a semiconductor material according to any of claims 1 or 2, wherein the semiconductor material is a wafer, comprising steps of supplying the etching gas to a wafer surface while applying laser radiation or light quantum irradiation on a part to be recessed, exciting a gas component of the etching gas on the irradiated part, chemically reacting a constituent of the wafer and the excited gas component so as to be volatilized and removed for forming a recess on the wafer surface, and moving the wafer relatively to the laser radiation or light quantum irradiation along a part to be processed in such a state so that a recess can be formed thereon.

* * * * *